United States Patent
Yang et al.

(10) Patent No.: US 8,575,962 B2
(45) Date of Patent: Nov. 5, 2013

(54) INTEGRATED CIRCUIT HAVING CRITICAL PATH VOLTAGE SCALING AND METHOD THEREFOR

(75) Inventors: Jianan Yang, Austin, TX (US); Stephen G. Jamison, Round Rock, TX (US); David L. Medlock, Mountain City, TX (US); Gary Waugh, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 141 days.

(21) Appl. No.: 13/220,302

(22) Filed: Aug. 29, 2011

(65) Prior Publication Data

US 2013/0049807 A1     Feb. 28, 2013

(51) Int. Cl.
*H03K 19/0175*     (2006.01)
*G06F 17/50*     (2006.01)

(52) U.S. Cl.
USPC ................................. 326/80; 326/93; 716/136

(58) Field of Classification Search
None
See application file for complete search history.

(56) References Cited

U.S. PATENT DOCUMENTS

| 7,245,153 | B2 | 7/2007 | Murakami |
| 2001/0011987 | A1 | 8/2001 | Kubota et al. |
| 2008/0278215 | A1* | 11/2008 | Sakai et al. .................. 327/398 |

OTHER PUBLICATIONS

Kahn, A., et al., "A 90-nm Power Optimization Methodology with Application to the ARM 1136JF-S Microprocessor", IEEE Journal of Solid-State Circuits, vol. 41, No. 8, Aug. 2006, pp. 1707-1717.
Kuroda, T., et al., "Low-Power CMOS Digital Design with Dual Embedded Adaptive Power Supplies", IEEE Journal of Solid-State Circuits, vol. 35, No. 4, Apr. 2000, pp. 652-655.

* cited by examiner

*Primary Examiner* — Crystal L Hammond
(74) *Attorney, Agent, or Firm* — Daniel D. Hill (57) ABSTRACT

An integrated circuit comprises logic circuitry having a plurality of signal paths. A signal path of the plurality of signal paths has a propagation delay greater than a propagation delay of any other signal path of the plurality of signal paths. The signal path includes a plurality of components. The plurality of components is provided with a higher power supply voltage than any other signal path of the plurality of signal paths.

15 Claims, 7 Drawing Sheets

INTEGRATED CIRCUIT HAVING CRITICAL PATH VOLTAGE SCALING AND METHOD THEREFOR

BACKGROUND

1. Field

This disclosure relates generally to integrated circuits, and more specifically, to an integrated circuit having critical path voltage scaling.

2. Related Art

A balance between energy efficiency, low power consumption, and performance is becoming increasing more important in integrated circuits. Voltage scaling is used in integrated circuits to adjust a power supply voltage of a circuit block according to desired performance. For example, the power supply voltage to a circuit block can be lowered at times when high performance is not as important as low power consumption. Some integrated circuits use transistors with a lower threshold voltage in timing critical paths to improve chip speed. However, the use of transistors with different threshold voltages on the same integrated circuit increases manufacturing complexity.

Therefore, what is needed is an integrated circuit and method that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a path level power supply voltage scaling method and integrated circuit. The method can be used to control the power supply voltage for a speed limiting critical path in an integrated circuit without adjusting the power supply voltage of an entire functional block. The power supply voltage of the critical path can be adjusted to change the gate delay. That is, increasing the power supply voltage for the critical path relative to the power supply voltage of the rest of the circuit block will decrease gate delay. The path level power supply voltage scaling method makes use of a flip-flop with a built-in level shifting capability. The path level voltage scaling method provides an adjustable speed/power trade-off at the path level instead of the block level. Also, fabrication cost can be reduced by potentially eliminating the need for transistors with different threshold voltages.

In one aspect, there is provided, an integrated circuit comprising logic circuitry having a plurality of signal paths, wherein a signal path of the plurality of signal paths has a propagation delay greater than a propagation delay of any other signal path of the plurality of signal paths, wherein the signal path includes a plurality of components, and wherein the plurality of components is provided with a higher power supply voltage than any other signal path of the plurality of signal paths. The plurality of components may include a plurality of logic gates. The signal path may comprise: a first flip-flop having an input terminal and an output terminal; a level shifter having an input terminal coupled to the output terminal of the first flip-flop, and an output terminal; a plurality of logic gates coupled to the output terminal of the level shifter and the output terminal of the first flip-flop; and a second flip-flop having an input terminal coupled to the plurality of logic gates. The level shifter may be integral with the first flip-flop. The flip-flop may include a master latch and a slave latch, and wherein the level shifter is integral with the master latch of the flip-flop. The first flip-flop and the integral level shifter may comprise: a master latch comprising: a first transistor having a first current electrode coupled to a first power supply voltage terminal, a control electrode, and a second current electrode; a second transistor having a first current electrode coupled to the second current electrode of the first transistor, a control electrode coupled to receive an input signal, and second current electrode; a third transistor having a first current electrode coupled to the second current electrode of the second transistor, a control electrode coupled to the control electrode of the second transistor, and a second current electrode coupled to a second power supply voltage terminal; a fourth transistor having a first current electrode coupled to the first power supply voltage terminal, a control electrode coupled to the second current electrode of the second transistor, and a second current electrode; a fifth transistor having a first current electrode coupled to the second current electrode of the fourth transistor, a control electrode, and a second current electrode coupled to the control electrode of the first transistor; and a sixth transistor having a first current electrode coupled to the second current electrode of the fifth transistor, a control electrode coupled to the control electrode of the fifth transistor, and a second current electrode coupled to the second power supply voltage terminal; and a slave latch coupled to the master latch. The slave latch may comprise a pair of cross-coupled inverters. The flip-flop may include a master latch and a slave latch, and wherein the level shifter may be integral with the slave latch of the flip-flop. The first flip-flop and the integral level shifter may comprise: a master latch; and a slave latch, the slave latch comprising: a first transistor having a first current electrode coupled to a first power supply voltage terminal, a control electrode, and a second current electrode; a second transistor having a first current electrode coupled to the second current electrode of the first transistor, a control electrode coupled to receive an input signal, and second current electrode; a third transistor having a first current electrode coupled to the second current electrode of the second transistor, a control electrode coupled to the control electrode of the second transistor, and a second current electrode coupled to a second power supply voltage terminal; a fourth transistor having a first current electrode coupled to the first power supply voltage terminal, a control electrode coupled to the second current electrode of the second transistor, and a second current electrode; a fifth transistor having a first current electrode coupled to the second current electrode of the fourth transistor, a control electrode, and a second current electrode coupled to the control electrode of the first transistor; and a sixth transistor having a first current electrode coupled to the second current electrode of the fifth transistor, a control electrode coupled to the control electrode of the fifth transistor, and a second current electrode coupled to the second power supply voltage terminal. The master latch may comprise a pair of cross-coupled inverters.

In another aspect, there is provided, an integrated circuit comprising: logic circuitry having a first plurality of circuit components, the first plurality of circuit components coupled together to form a plurality of signal paths, wherein a signal path of the plurality of signal paths is characterized as being a critical path, wherein a second plurality of circuit components of the critical path receives a different power supply voltage than the first plurality of circuit components, the second plurality of circuit components comprising. a first flip-flop with integral level shifter having an input terminal and an output terminal; a plurality of logic gates coupled to the output terminal; and a second flip-flop having an input terminal coupled to the plurality of logic gates, and an output terminal. The first flip-flop with integral level shifter may comprise: a master latch comprising: a first transistor having a first current electrode coupled to a first power supply voltage terminal, a control electrode, and a second current electrode; a second transistor having a first current electrode coupled to the second current electrode of the first transistor, a control electrode coupled to receive an input signal, and second current electrode; a third transistor having a first current electrode coupled to the second current electrode of the second transistor, a control electrode coupled to the control electrode of the second transistor, and a second current electrode coupled to a second power supply voltage terminal; a fourth transistor having a first current electrode coupled to the first power supply voltage terminal, a control electrode coupled to the second current electrode of the second transistor, and a second current electrode; a fifth transistor having a first current electrode coupled to the second current electrode of the fourth transistor, a control electrode, and a second current electrode coupled to the control electrode of the first transistor; and a sixth transistor having a first current electrode coupled to the second current electrode of the fifth transistor, a control electrode coupled to the control electrode of the fifth transistor, and a second current electrode coupled to the second power supply voltage terminal; and a slave latch coupled to the master latch. The first flip-flop with integral level shifter may comprise: a master latch; and a slave latch, the slave latch comprising: a first transistor having a first current electrode coupled to a first power supply voltage terminal, a control electrode, and a second current electrode; a second transistor having a first current electrode coupled to the second current electrode of the first transistor, a control electrode coupled to receive an input signal, and second current electrode; a third transistor having a first current electrode coupled to the second current electrode of the second transistor, a control electrode coupled to the control electrode of the second transistor, and a second current electrode coupled to a second power supply voltage terminal; a fourth transistor having a first current electrode coupled to the first power supply voltage terminal, a control electrode coupled to the second current electrode of the second transistor, and a second current electrode; a fifth transistor having a first current electrode coupled to the second current electrode of the fourth transistor, a control electrode, and a second current electrode coupled to the control electrode of the first transistor; and a sixth transistor having a first current electrode coupled to the second current electrode of the fifth transistor, a control electrode coupled to the control electrode of the fifth transistor, and a second current electrode coupled to the second power supply voltage terminal. The second plurality of circuit components of the critical path may receive a higher power supply voltage than the first plurality of circuit components. The critical path may have a longer propagation delay than substantially all of the plurality of signal paths.

In yet another aspect, there is provided, a method for testing an integrated circuit design, the method comprising: identifying a first plurality of circuit components that comprise a critical path in the integrated circuit design; identifying a second plurality of circuit components that comprise a non-critical path in the integrated circuit design; providing a first power supply voltage to the first plurality of circuit components of the critical path; and providing a second power supply voltage to the second plurality of circuit components, the second power supply voltage being lower than the first power supply voltage. The first and second pluralities of circuit components may each comprise digital circuitry. The critical path may provide a higher gate delay relative to a gate delay of the non-critical path. The first and second pluralities of circuit components may each comprise a plurality of logic gates. In the method prior to identifying the first plurality of circuit components that comprises a critical path in the integrated circuit, the method may further comprise: identifying substantially all of the circuit paths in the integrated circuit; and operating the integrated circuit at the second power supply voltage to identify the critical path.

The semiconductor substrate described herein can be any semiconductor material or combinations of materials, such as gallium arsenide, silicon germanium, silicon-on-insulator (SOI), silicon, monocrystalline silicon, the like, and combinations of the above.

As used herein the term metal-oxide-semiconductor and the abbreviation MOS are to be interpreted broadly, in particular, it should be understood that they are not limited merely to structures that use "metal" and "oxide" but may employ any type of conductor including "metal" and any type of dielectric including "oxide". The term field effect transistor is abbreviated as "FET".

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Figure 1:
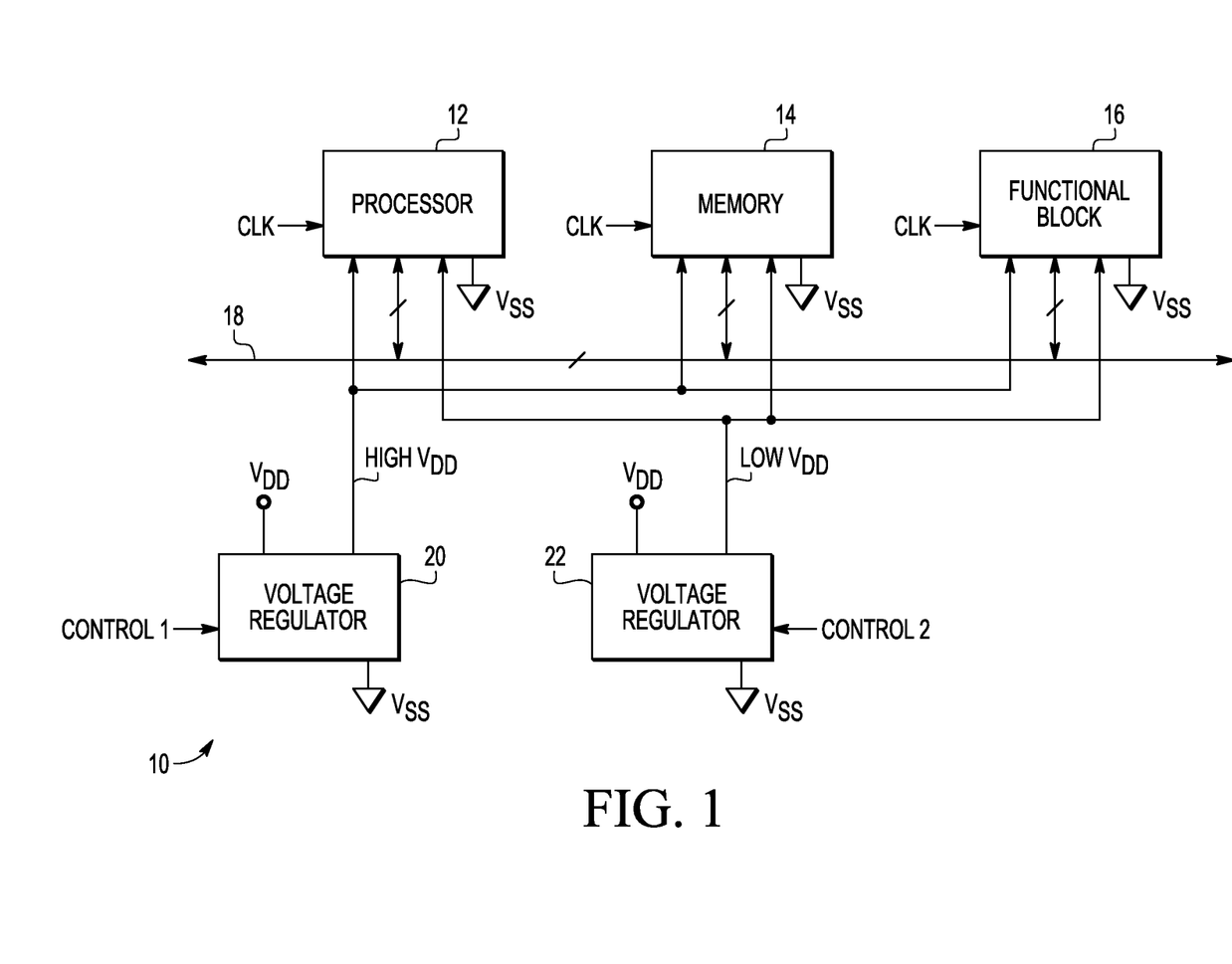
FIG. 1 illustrates, in block diagram form, a data processing system in accordance with an embodiment.

FIG. 1 illustrates in a simplistic block diagram form, data processing system 10 in accordance with an embodiment. In the illustrated embodiment, data processing system 10 is implemented on a single integrated circuit. Data processing system 10 includes processor 12, memory 14, functional block 16, bus 18, and voltage regulators 20 and 22. Each of processor 12, memory 14 and functional block 16 are bi-directionally connected to bus 18. Bus 18 includes a plurality of conductors for transmitting data, control, and address signals between the various blocks of data processing system 10. In one embodiment, processor 12 is a microprocessor core. In another embodiment, processor 12 can include any number of processor cores. Memory 14 can be any type of volatile or non-volatile memory. Functional block 16 can be any type of digital circuit, analog circuit, or include both digital and analog circuits for performing a function. For example, functional block 16 may be combinational logic for performing a specific function. Also, functional block 16 may be a DMA (direct memory access) controller, a CAN (control area network) module, an analog-to-digital converter, digital-to-analog converter, serial-to-parallel interface, etc. There can be any number of functional blocks 16 in data processing system 10. Processor 12, memory 14, and functional block 16 each receive a clock signal labeled "CLK". The clock signal CLK may be generated on the integrated circuit or generated external to the integrated circuit.

Voltage regulators 20 and 22 are for supplying one or more power supply voltages to the various components of data processing system 10. Voltage regulators 20 and 22 each receive an externally generated power supply voltage labeled "VDD". In response, voltage regulator 20 provides a regulated power supply voltage labeled "HIGH VDD", and voltage regulator 22 provides a regulated power supply voltage labeled "LOW VDD". As indicated by the signal names, power supply voltage HIGH VDD is at a higher voltage level than power supply voltage LOW VDD. In one embodiment, power supply voltages HIGH VDD and LOW VDD can be selectively provided in response to control signals, such as control signals labeled "CONTROL 1" and "CONTROL 2". The power supply voltages may be selectively provided in response to different operating mode of data processing system 10. For example, in a power conserving operating mode the lower power supply voltage LOW VDD may be provided to each functional block. If higher performance is required, the higher power supply voltage HIGH VDD may be provided to each functional block. However, the use of different operating modes is not important for purposes of describing the present embodiments and will not be described further.

In the illustrated embodiment, power supply voltage VSS is at zero potential, or ground. In one embodiment, LOW VDD may be 0.6 volts and HIGH VDD may be 1.0 volts. In other embodiments, the voltage levels may be different. In another embodiment, the actual voltage level of the power supply voltages may be adjustable.

The power supply voltages may be generated and provided to data processing system 10 in many different ways. In other embodiments, voltage regulators 20 and 22 may not be used. For example, in one embodiment, the power supply voltages may be generated external to data processing system 10 and then provided to the circuit blocks of data processing system 10 via external pins. In whatever method the power supply voltages are generated, a power supply scheme may be provided that allows the various functional blocks of data processing system 10 to operate at different power supply voltage levels depending on desired performance.

In a data processing system that uses more than one power supply voltage, the data processing system may be organized into voltage domains. Signals that are transmitted from one voltage domain to another voltage domain may require voltage level shifting before being transmitted from, for example, a voltage domain operating a relatively lower power supply voltage to a voltage domain operating at a relatively higher power supply voltage. A block, or module, of data processing system 10, such as for example, functional block 16, may comprise a voltage domain. Also, to further conserve power, certain transistors within a voltage domain may be fabricated with higher threshold voltages to reduce leakage current.

Various signals may be transmitted through a functional circuit block of data processing system 10. The type of signals may be data, address, or control. The type of circuit components may include digital circuits, analog circuits, or a combination of digital and analog circuits. In one embodiment, functional block 16 includes a plurality of logic gate functions, or combinational logic. The plurality of logic gate functions may include but are not limited to NAND, NOR, AND, OR, inverter, buffer, shift left or shift right, exclusive OR, and exclusive NOR. The timing of the various signals relative to each other through the functional circuit block may be important for the circuit to operate correctly. The timing of one or more circuit paths may be a "critical path". A critical path is a path through combinational logic or other electrical circuitry that provides a maximum, or worse case, amount of delay that will limit circuit performance or one or more various margins. The critical path may be a path that prevents the functional circuit from meeting timing requirements, especially for higher clock speeds. In accordance with one embodiment, the power supply voltage for components of the critical path is increased to lessen the delay. The power supply provided to the rest of the combinational logic is lowered to reduce power consumption. There can be more than one critical path in a circuit block.

Figure 2:
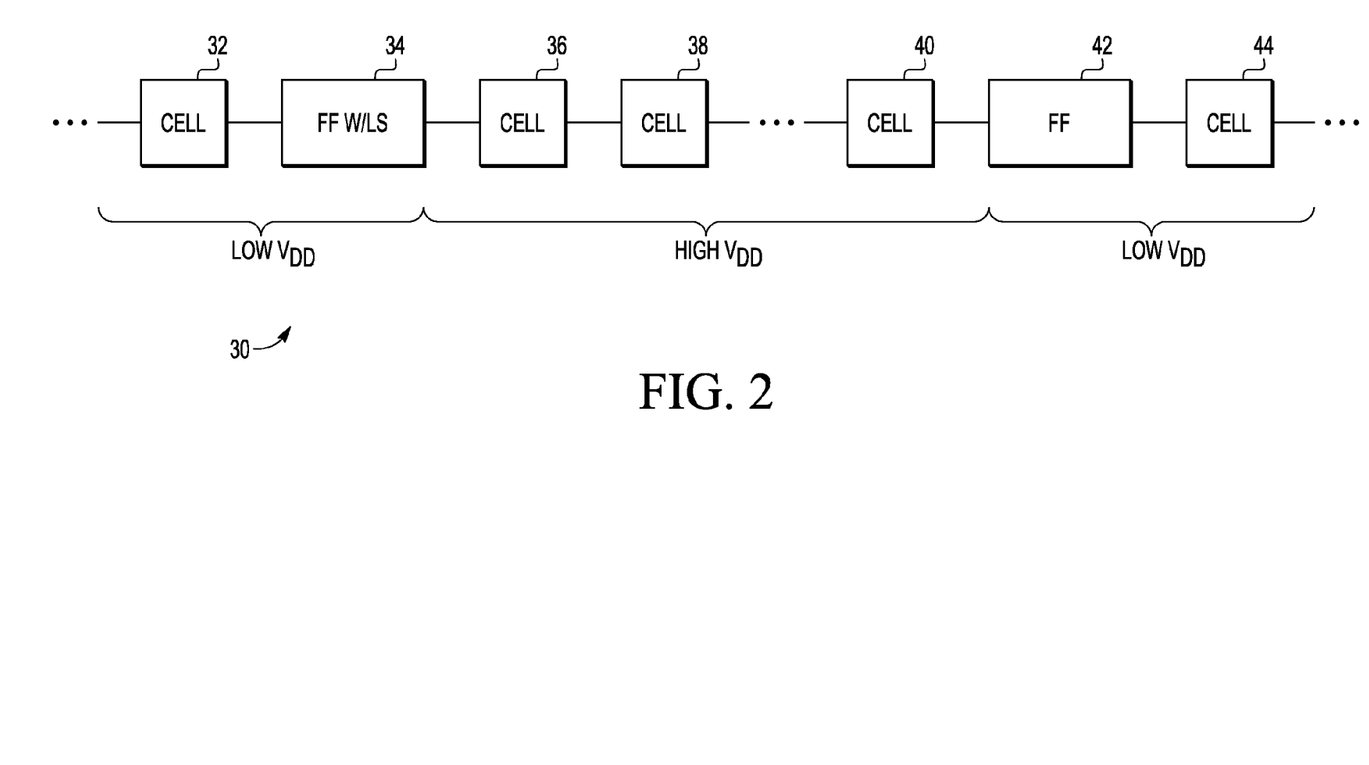
FIG. 2 illustrates, in block diagram form, a timing critical path in the data processing system of FIG. 1.

FIG. 2 illustrates, in block diagram form, a simplistic view of a portion of a timing critical path 30 in data processing system 10 of FIG. 1. Critical path 30 includes flip-flop with integral level shifter 34, combinational logic cells 36, 38, 40, and flip-flop 42. Note that in the described embodiment, a critical path such as critical path 30 begins and ends with a flip-flop. In FIG. 2, the flow of data is from left to right and combinational logic cell 32 is an example of a cell that precedes critical path 30 and combinational logic cell 44 is an example of a cell that follows critical path. The critical path may include branches to other data paths (not shown). During the design of an integrated circuit that includes data processing system 10, it was determined that critical path 30 has a maximum amount of gate delay, or more gate delay than most other circuit paths in the integrated circuit. To reduce the amount of delay in accordance the illustrated embodiment, the power supply voltage for critical path 30 is increased. As illustrated in FIG. 2, cells 36, 38, and 40 and about half of flip-flop with level shifter 34 receive the higher power supply voltage HIGH VDD. The cells not in the critical path, i.e. cells 32 and 44, flip-flop 42, and the other half of flip-flop with integral level shifter 34 receive the lower power supply voltage LOW VDD. The use of the higher power supply voltage HIGH VDD reduces the gate delay of each of the cells and flip-flops in critical path 30. Reducing the gate delay may also improve voltage margins in the critical path. The use of the lower power supply voltage LOW VDD in the rest of the functional circuit block minimizes power consumption. Flip-flop with level shifter 34 is only needed when transitioning a signal from a low power supply voltage to a relatively higher power supply voltage. When transitioning a signal from a high power supply voltage to a relatively lower power supply voltage, a level shifter is not needed and a conventional flip-flop can be used. Using the higher power supply voltage to adjust the gate delay of the critical path instead of, for example, adjusting the threshold voltage of each of the transistors in the critical path simplifies design and manufacturing of the integrated circuit.

Figure 3:
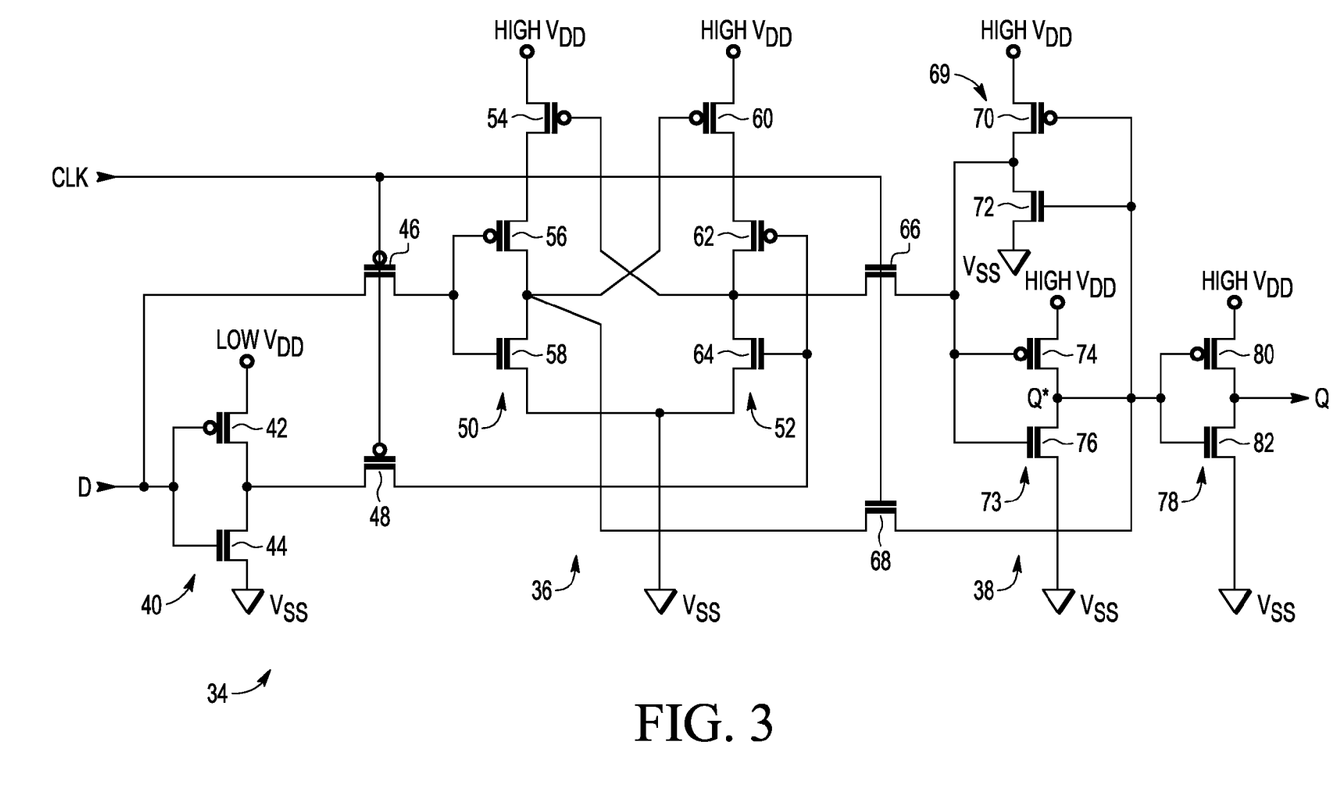
FIG. 3 illustrates, in schematic diagram form, a flip-flop with integral level shifter of the timing critical path of FIG. 2 in accordance with an embodiment.

FIG. 3 illustrates, in schematic diagram form, flip-flop with integral level shifter 34 that can be used in the critical path 30 of FIG. 2 in accordance with one embodiment. In the illustrated embodiment, flip-flop with integral level shifter 34 is implemented using a conventional complementary metal-oxide semiconductor (CMOS) manufacturing process. Flip-flop with integral level shifter 34 is a DQ flip-flop and includes inverters 40 and 78, P-channel pass transistors 46 and 48, master latch 36, N-channel pass transistors 66 and 68, and slave latch 38. Inverter 40 includes P-channel transistor 42 and N-channel transistor 44. Master latch 36 includes inverters 50 and 52, and P-channel transistors 54 and 60. Slave latch 38 includes cross-coupled inverters 69 and 73. Inverter 50 includes P-channel transistor 56 and N-channel transistor 58. Inverter 52 includes P-channel transistor 62 and N-channel transistor 64. Inverter 69 includes P-channel transistor 70 and N-channel transistor 72. Inverter 73 includes P-channel transistor 74 and N-channel transistor 76. Inverter 78 includes P-channel transistor 80 and N-channel transistor 82.

In inverter 40, P-channel transistor 42 has a first current electrode (source) connected to a power supply voltage terminal labeled "LOW VDD", a second current electrode (drain), and a control electrode (gate) for receiving an input data signal labeled "D". N-channel transistor 44 has a drain connected to the drain of P-channel transistor 42, a source connected to VSS, and a gate connected to the gate of P-channel transistor 42. P-channel pass transistor 46 has a first source/drain connected to the gates of transistors 42 and 44, a gate for receiving clock signal CLK, and a second source/drain. P-channel pass transistor 48 has first source/drain connected to the drains of transistors 42 and 44, a gate connected to receive clock signal CLK, and a second source/drain. In master latch 36, P-channel transistors 54 and 60 function as cross-coupled current sources for inverters 50 and 52, respectively. Specifically, P-channel transistor 54 has a source connected to the power supply voltage terminal labeled HIGH VDD, a drain, and a gate. P-channel transistor 56 has a source connected to the drain of P-channel transistor 54, a drain connected to power supply voltage terminal VSS, and a gate connected to the second source/drain of pass transistor 46. N-channel transistor 58 has a drain connected to the drain of P-channel transistor 56, a gate connected to the gate of transistor 56, and a source connected to VSS. P-channel transistor 60 has a source connected to power supply voltage terminal HIGH VDD, a gate connected to the drains of transistors 56 and 58, and a drain. P-channel transistor 62 has a source connected to the drain of transistor 60, a gate connected to the second source/drain of pass transistor 48, and a source connected to VSS. N-channel transistor 64 has a drain connected to the drain of P-channel transistor 62, a gate connected to the gate of P-channel transistor 62, and a source connected to VSS. N-channel pass transistor 66 has a first source/drain connected to the drains of transistors 62 and 64, a gate connected to receive clock signal CLK, and a second source/drain. N-channel pass transistor 68 has a first source/drain connected to the drains of transistors 56 and 58, a gate connected to receive clock signal CLK, and a second source/drain.

In slave latch 38, P-channel transistor 70 has a source connected to power supply voltage terminal HIGH VDD, a gate connected to the second source/drain of pass transistor 68, and a drain connected to the second source/drain of pass transistor 66. N-channel transistor 72 has a drain connected to the source of P-channel transistor 70, a gate connected to the gate of transistor 70, and a source connected to VSS. P-channel transistor 74 has a source connected to HIGH VDD, a gate connected to the second source/drain of pass transistor 66, and a drain connected to the second source/drain of pass transistor 68. The drain of transistor 74 labeled "Q*", where the asterisk (*) indicates the signal is a logic complement of a signal having the same name but lacking the asterisk (*). N-channel transistor 76 has a drain connected to the drain of transistor 74, a gate connected to the gate of transistor 74, and a source connected to VSS. P-channel transistor 80 has a source connected to HIGH VDD, a gate connected to the second source/drain of pass transistor 68, and a drain for providing an output data signal labeled "Q". N-channel transistor 82 has a drain connected to the drain of transistor 80, a gate connected to the gate of transistor 80, and a source connected to VSS.

In operation, input signal D is provided to pass transistor 46 and to the input of inverter 40. Input signal D is a low voltage signal being provided at the low power supply voltage LOW VDD. Clock signal CLK is a high power supply voltage signal. When clock signal CLK is a logic low, P-channel pass transistors 46 and 48 are conductive. Input signal D is passed to the input of inverter 50, and a logical complement of input signal D is provided by inverter 40 through pass transistor 48 to the input of inverter 52. The level shifting operation is done by master latch 36. The low voltage input signal D is level shifted to the high power supply voltage by the operation of master latch 36. When input signal D is a logic high, inverter 50 provides a logic low to the gate of P-channel transistor 60 and inverter 40 provides a logic low input signal D to the input of inverter 52. P-channel transistor 60 is conductive and P-channel transistor 54 is substantially non-conductive. The non-conductive P-channel transistor 54 ensures that the gate of P-channel transistor 60 is low. Because P-channel transistor 60 is conductive, a current path exists between HIGH VDD and VSS through transistors 60, 62, and 64. Inverter 52 provides a level shifted logic high signal to pass transistor 66. When clock signal CLK is a logic high, pass transistor 66 is conductive and the logic one that was provided by inverter 52 is latched in slave latch 38. Slave latch 38 provides output signal Q* as a logic low and inverter 78 provides output signal Q as a logic high. Flip-flop with integral level shifter 34 provides the level shifting function without adding a gate delay.

Figure 4:
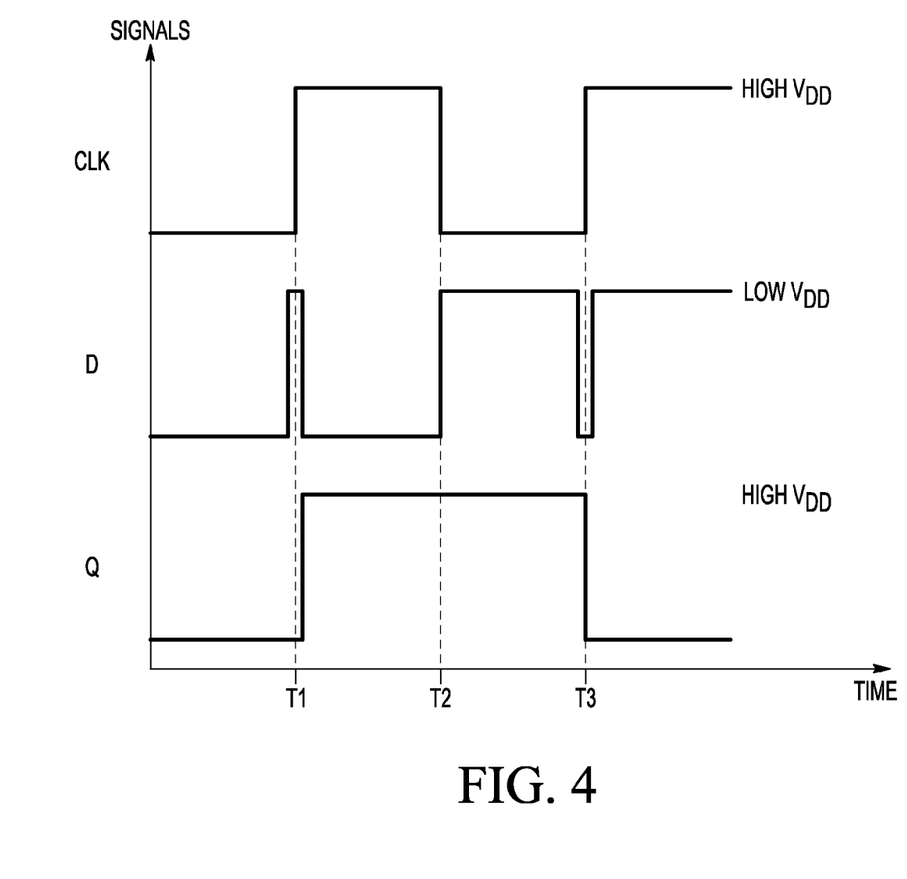
FIG. 4 illustrates a timing diagram of various signals of the flip-flop with integral level shifter of FIG. 3.

FIG. 4 illustrates a timing diagram of various signals of flip-flop with integral level shifter 34 of FIG. 3. As can be seen in FIG. 4, clock signal CLK is at the high power supply voltage HIGH VDD. Input signal D is provided at the low power supply voltage LOW VDD and level shifted to become output signal Q at the high power supply voltage HIGH VDD. Input signal D is provided as a momentary pulse on the rising edge of clock signal CLK at time T1. Output signal Q becomes a logic high just after time T1. At time T2 clock signal CLK returns to a logic low. At time T3 input signal D is provided as a logic low and just after time T3 output signal Q becomes a logic low.

Figure 5:
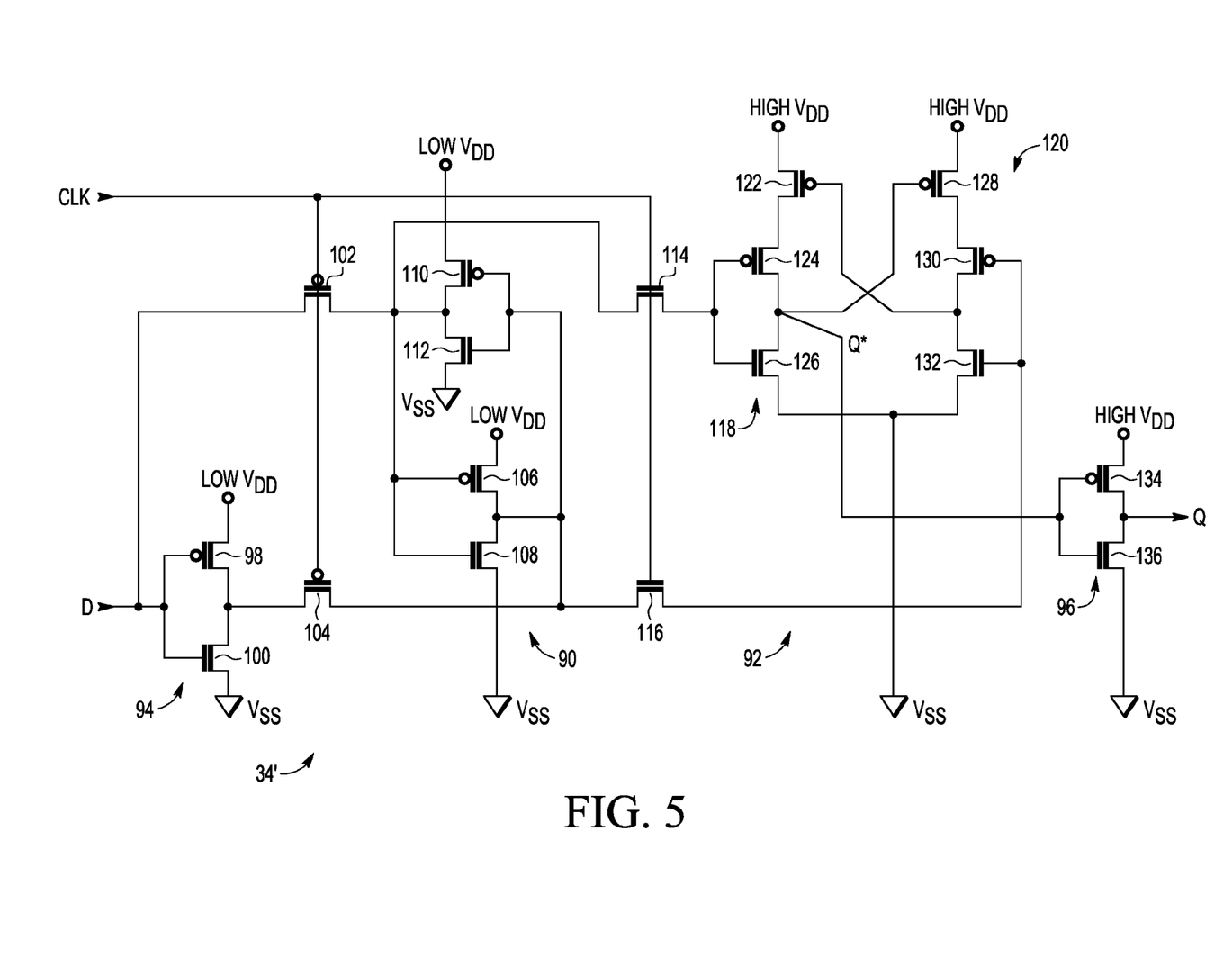
FIG. 5 illustrates, in schematic diagram form, a flip-flop with integral level shifter of the timing critical path of FIG. 2 in accordance with another embodiment.

FIG. 5 illustrates, in schematic diagram form, flip-flop with integral level shifter 34' that can be used in the critical path of FIG. 2 in accordance with another embodiment. In the illustrated embodiment, flip-flop with integral level shifter 34' is implemented using a conventional CMOS manufacturing process. Flip-flop with integral level shifter 34' is a DQ flop-flop and includes inverters 94 and 96, P-channel pass transistors 102 and 104, master latch 90, N-channel pass transistors 114 and 116, and slave latch with integral level shifter 92. Note that flip-flop 34' differs from flip-flop 34 in where in the flip-flop the level shifter is located, the power supply voltage levels, and the voltage level of clock signal CLK. Also, master latch 90 is substantially the same as slave latch 38 and slave latch 92 is substantially the same as master latch 36. Clock signal CLK is provided at the voltage level of power supply voltage LOW VDD. Master latch 90 receives power supply voltage LOW VDD.

In operation, input signal D is provided to pass transistor 102 and to the input of inverter 94. Input signal D is a low voltage signal being provided at the low power supply voltage LOW VDD. Clock signal CLK is at the voltage level of low power supply voltage LOW VDD. When clock signal CLK is a logic low, P-channel pass transistors 102 and 104 are conductive. The logic state of input signal D is latched in the cross-coupled inverters of master latch 90. When clock signal CLK becomes a logic high, N-channel pass transistors 114 and 116 become conductive and provide the latch logic state of master latch 90 to the slave latch 92. Slave latch 92 functions similarly to master latch 36 of FIG. 3 and performs the level shifting function from the voltage level of LOW VDD to the relatively higher voltage level of HIGH VDD. In one embodiment, LOW VDD is 0.6 volts and HIGH VDD is 1.0 volts. In another embodiment, the power supply voltages may be different. When input signal D is a logic high, inverter 118 provides a logic low to the gate of P-channel transistor 128 and a logic high is provided to the input of inverter 120. P-channel transistor 128 is conductive and P-channel transistor 122 is substantially non-conductive. The non-conductive P-channel transistor 122 ensures that the gate of P-channel transistor 128 is low. Because P-channel transistor 128 is conductive, a current path exists between HIGH VDD and VSS through transistors 128, 130, and 132. Inverter 118 provides a logic low signal Q* to the input of inverter 96. Inverter 96 provides a logic high output signal Q.

Figure 6:
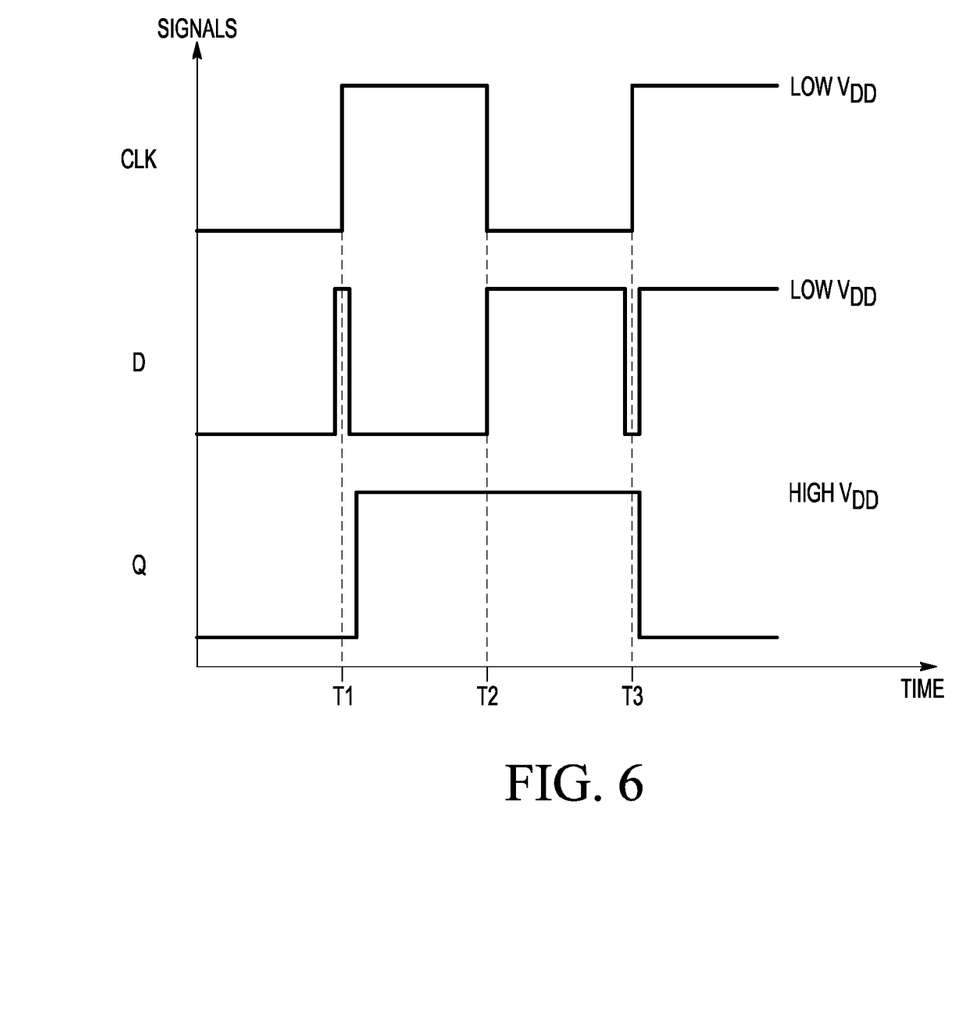
FIG. 6 illustrates a timing diagram of various signals of the flip-flop with integral level shifter of FIG. 5.

FIG. 6 illustrates a timing diagram of various signals of flip-flop with integral level shifter 34' of FIG. 5. In FIG. 6, clock signal CLK is provided at the voltage level of LOW VDD, input signal D is provided at the low voltage level of LOW VDD, and output signal Q is provided at the relatively high voltage level of HIGH VDD. At time T1, clock signal CLK transitions from a logic low to a logic high and input signal D is provided as a logic high. Just after time T1, output signal Q becomes a logic high. At time T2, clock signal CLK transitions to a logic low and input signal D becomes a logic high. At time T3, clock signal CLK again transitions to a logic high. Input signal D is pulsed low, and output signal Q becomes a logic low just after time T3.

Figure 7:
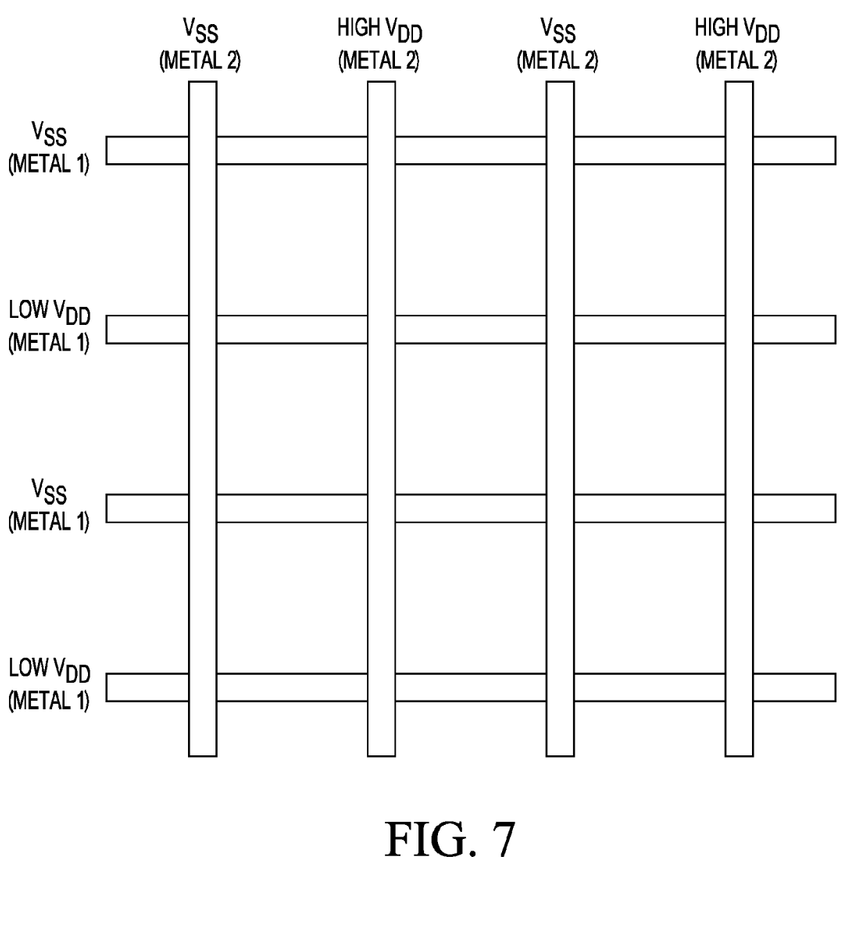
FIG. 7 illustrates a power supply layout of the data processing system of FIG. 1 in accordance with an embodiment.

FIG. 7 illustrates a power supply layout of the data processing system of FIG. 1 in accordance with an embodiment. The power supply layout of FIG. 7 uses two metal layers. In the illustrated embodiment, metal layer METAL 1 is the lowest metal layer and metal layer METAL 2 is the next layer above METAL 1. In other embodiments, the metal layers may be different. Metal layer METAL 1 conductors run in a horizontal direction and alternately supply VSS and power supply voltage LOW VDD. Note that in the illustrated embodiment, VSS is coupled to ground. Metal 2 conductors run in the vertical direction and alternately supply VSS and power supply voltage HIGH VDD. The combination of METAL 1 and METAL 2 conductors appears similar to a power supply grid.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:
1. An integrated circuit comprising:
 logic circuitry having a plurality of signal paths, wherein a signal path of the plurality of signal paths has a propagation delay greater than a propagation delay of any other signal path of the plurality of signal paths, wherein the signal path includes a plurality of components, and wherein the plurality of components is provided with a higher power supply voltage than any other signal path of the plurality of signal paths, and wherein the signal path includes an integral flip-flop and level shifter that includes
 a data input;
 a data output;
 a first inverter coupled to the data input and configured to receive an input data signal at a low voltage and to output the input data signal and a logical complement of the input data signal;
 a plurality of latches coupled to the first inverter, wherein the plurality of latches is configured to receive the input data signal and the logical complement of the input data signal, and to perform level shifting and latching operations to shift the low voltage input data signal to the higher power supply voltage, resulting in a high voltage data signal; and
 a second inverter coupled between the plurality of latches and the data output, wherein the second inverter is configured to invert the high voltage data signal produced by the plurality of latches.

2. The integrated circuit of claim 1, wherein the plurality of components includes a plurality of logic gates.

3. The integrated circuit of claim 1, wherein the signal path comprises:
  a first flip-flop having an input terminal and an output terminal;
  a level shifter having an input terminal coupled to the output terminal of the first flip-flop, and an output terminal;
  a plurality of logic gates coupled to the output terminal of the level shifter and the output terminal of the first flip-flop; and
  a second flip-flop having an input terminal coupled to the plurality of logic gates.

4. The integrated circuit of claim 3, wherein the level shifter is integral with the first flip-flop.

5. The integrated circuit of claim 4, wherein the first flip-flop includes a master latch and a slave latch, and wherein the level shifter is integral with the master latch of the first flip-flop.

6. The integrated circuit of claim 4, wherein the first flip-flop includes a master latch and a slave latch, and wherein the level shifter is integral with the slave latch of the flip-flop.

7. An integrated circuit comprising:
  logic circuitry having a plurality of signal paths, wherein a signal path of the plurality of signal paths has a propagation delay greater than a propagation delay of any other signal path of the plurality of signal paths, wherein the signal path includes a plurality of components, and wherein the plurality of components is provided with a higher power supply voltage than any other signal path of the plurality of signal paths, wherein the signal path comprises:
    a first flip-flop having an input terminal and an output terminal;
    a level shifter having an input terminal coupled to the output terminal of the first flip-flop, and an output terminal, wherein the level shifter is integral with the first flip-flop;
    a plurality of logic gates coupled to the output terminal of the level shifter and the output terminal of the first flip-flop; and
    a second flip-flop having an input terminal coupled to the plurality of logic gates, and
  wherein the first flip-flop and the integral level shifter comprises:
    a master latch comprising:
      a first transistor having a first current electrode coupled to a first power supply voltage terminal, a control electrode, and a second current electrode;
      a second transistor having a first current electrode coupled to the second current electrode of the first transistor, a control electrode coupled to receive an input signal, and second current electrode;
      a third transistor having a first current electrode coupled to the second current electrode of the second transistor, a control electrode coupled to the control electrode of the second transistor, and a second current electrode coupled to a second power supply voltage terminal;
      a fourth transistor having a first current electrode coupled to the first power supply voltage terminal, a control electrode coupled to the second current electrode of the second transistor, and a second current electrode;
      a fifth transistor having a first current electrode coupled to the second current electrode of the fourth transistor, a control electrode, and a second current electrode coupled to the control electrode of the first transistor; and
      a sixth transistor having a first current electrode coupled to the second current electrode of the fifth transistor, a control electrode coupled to the control electrode of the fifth transistor, and a second current electrode coupled to the second power supply voltage terminal; and
    a slave latch coupled to the master latch.

8. The integrated circuit of claim 7, wherein the slave latch comprises a pair of cross-coupled inverters.

9. An integrated circuit comprising:
  logic circuitry having a plurality of signal paths, wherein a signal path of the plurality of signal paths has a propagation delay greater than a propagation delay of any other signal path of the plurality of signal paths, wherein the signal path includes a plurality of components, and wherein the plurality of components is provided with a higher power supply voltage than any other signal path of the plurality of signal paths, wherein the signal path comprises:
    a first flip-flop having an input terminal and an output terminal;
    a level shifter having an input terminal coupled to the output terminal of the first flip-flop, and an output terminal, wherein the level shifter is integral with the first flip-flop;
    a plurality of logic gates coupled to the output terminal of the level shifter and the output terminal of the first flip-flop; and
    a second flip-flop having an input terminal coupled to the plurality of logic gates, and
  wherein the first flip-flop and the integral level shifter comprises:
    a master latch; and
    a slave latch, the slave latch comprising:
      a first transistor having a first current electrode coupled to a first power supply voltage terminal, a control electrode, and a second current electrode;
      a second transistor having a first current electrode coupled to the second current electrode of the first transistor, a control electrode coupled to receive an input signal, and second current electrode;
      a third transistor having a first current electrode coupled to the second current electrode of the second transistor, a control electrode coupled to the control electrode of the second transistor, and a second current electrode coupled to a second power supply voltage terminal;
      a fourth transistor having a first current electrode coupled to the first power supply voltage terminal, a control electrode coupled to the second current electrode of the second transistor, and a second current electrode;
      a fifth transistor having a first current electrode coupled to the second current electrode of the fourth transistor, a control electrode, and a second current electrode coupled to the control electrode of the first transistor; and a sixth transistor having a first current electrode coupled to the second current electrode of the fifth transistor, a control electrode coupled to the control electrode of the fifth transistor, and a second current electrode coupled to the second power supply voltage terminal.

10. The integrated circuit of claim 9, wherein the master latch comprises a pair of cross-coupled inverters.

11. An integrated circuit comprising:
logic circuitry having a first plurality of circuit components, the first plurality of circuit components coupled together to form a plurality of signal paths, wherein a signal path of the plurality of signal paths is characterized as being a critical path, wherein a second plurality of circuit components of the critical path receives a different power supply voltage than the first plurality of circuit components, the second plurality of circuit components comprising
a first flip-flop with integral level shifter having an input terminal and an output terminal;
a plurality of logic gates coupled to the output terminal; and
a second flip-flop having an input terminal coupled to the plurality of logic gates, and an output terminal,
wherein the first flip-flop and the integral level shifter comprises:
a plurality of latches configured to receive an input data signal and a logical complement of the input data signal, and to perform level shifting and latching operations to shift the low voltage input data signal to the higher power supply voltage, resulting in a high voltage data signal.

12. The integrated circuit of claim 11, wherein the second plurality of circuit components of the critical path receives a higher power supply voltage than the first plurality of circuit components.

13. The integrated circuit of claim 11, wherein the critical path has a longer propagation delay than substantially all of the plurality of signal paths.

14. An integrated circuit comprising:
logic circuitry having a first plurality of circuit components, the first plurality of circuit components coupled together to form a plurality of signal paths, wherein a signal path of the plurality of signal paths is characterized as being a critical path, wherein a second plurality of circuit components of the critical path receives a different power supply voltage than the first plurality of circuit components, the second plurality of circuit components comprising.
a first flip-flop with integral level shifter having an input terminal and an output terminal;
a plurality of logic gates coupled to the output terminal; and
a second flip-flop having an input terminal coupled to the plurality of logic gates, and an output terminal, and
wherein the first flip-flop with integral level shifter comprises:
a master latch comprising:
a first transistor having a first current electrode coupled to a first power supply voltage terminal, a control electrode, and a second current electrode;
a second transistor having a first current electrode coupled to the second current electrode of the first transistor, a control electrode coupled to receive an input signal, and second current electrode;
a third transistor having a first current electrode coupled to the second current electrode of the second transistor, a control electrode coupled to the control electrode of the second transistor, and a second current electrode coupled to a second power supply voltage terminal;
a fourth transistor having a first current electrode coupled to the first power supply voltage terminal, a control electrode coupled to the second current electrode of the second transistor, and a second current electrode;
a fifth transistor having a first current electrode coupled to the second current electrode of the fourth transistor, a control electrode, and a second current electrode coupled to the control electrode of the first transistor; and
a sixth transistor having a first current electrode coupled to the second current electrode of the fifth transistor, a control electrode coupled to the control electrode of the fifth transistor, and a second current electrode coupled to the second power supply voltage terminal; and
a slave latch coupled to the master latch.

15. An integrated circuit comprising:
logic circuitry having a first plurality of circuit components, the first plurality of circuit components coupled together to form a plurality of signal paths, wherein a signal path of the plurality of signal paths is characterized as being a critical path, wherein a second plurality of circuit components of the critical path receives a different power supply voltage than the first plurality of circuit components, the second plurality of circuit components comprising.
a first flip-flop with integral level shifter having an input terminal and an output terminal;
a plurality of logic gates coupled to the output terminal; and
a second flip-flop having an input terminal coupled to the plurality of logic gates, and an output terminal, and
wherein the first flip-flop with integral level shifter comprises:
a master latch; and
a slave latch, the slave latch comprising:
a first transistor having a first current electrode coupled to a first power supply voltage terminal, a control electrode, and a second current electrode;
a second transistor having a first current electrode coupled to the second current electrode of the first transistor, a control electrode coupled to receive an input signal, and second current electrode;
a third transistor having a first current electrode coupled to the second current electrode of the second transistor, a control electrode coupled to the control electrode of the second transistor, and a second current electrode coupled to a second power supply voltage terminal;
a fourth transistor having a first current electrode coupled to the first power supply voltage terminal, a control electrode coupled to the second current electrode of the second transistor, and a second current electrode;
a fifth transistor having a first current electrode coupled to the second current electrode of the fourth transistor, a control electrode, and a second current electrode coupled to the control electrode of the first transistor; and a sixth transistor having a first current electrode coupled to the second current electrode of the fifth transistor, a control electrode coupled to the control electrode of the fifth transistor, and a second current electrode coupled to the second power supply voltage terminal.

* * * * *